United States Patent
Tsai

[19]

[11] Patent Number: 6,009,496
[45] Date of Patent: Dec. 28, 1999

[54] MICROCONTROLLER WITH PROGRAMMABLE EMBEDDED FLASH MEMORY

[75] Inventor: Hsi-Jung Tsai, Hsinchu Hsien, Taiwan

[73] Assignee: Winbond Electronics Corp., Taiwan

[21] Appl. No.: 09/000,959

[22] Filed: Dec. 30, 1997

[51] Int. Cl.[6] .............................. G06F 12/00; G11C 8/00
[52] U.S. Cl. .............. 711/103; 365/189.05; 365/185.09; 365/185.11; 712/37
[58] Field of Search ....................... 711/103; 365/189.05, 365/185.09, 185.11; 712/37, 38; 713/600

[56] References Cited

U.S. PATENT DOCUMENTS

| | | | |
|---|---|---|---|
| 4,578,751 | 3/1986 | Erwin ........................................ | 714/720 |
| 5,053,990 | 10/1991 | Kreifels et al. ........................... | 711/103 |
| 5,210,854 | 5/1993 | Beaverton et al. ....................... | 711/103 |
| 5,268,870 | 12/1993 | Harari ................................... | 365/185.09 |
| 5,495,593 | 2/1996 | Elmer et al. ............................. | 711/103 |
| 5,553,020 | 9/1996 | Keeney et al. ....................... | 365/185.19 |
| 5,596,734 | 1/1997 | Ferra ........................................ | 711/4 |
| 5,765,184 | 6/1998 | Durante .................................. | 711/103 |
| 5,873,113 | 2/1999 | Rezvani .................................. | 711/103 |
| 5,901,330 | 5/1999 | Sun et al. ................................ | 711/103 |
| 5,944,837 | 8/1999 | Talreja et al. ........................... | 713/600 |

*Primary Examiner*—Tuan V. Thai
*Attorney, Agent, or Firm*—Rabin & Champagne, PC

[57] ABSTRACT

An architecture for microcontroller with embedded flash memory is provided. The microcontroller allows the reprogramming of data into the embedded flash memory of the microcontroller to be performed on-board without having to dismount the entire IC package of the microcontroller from the circuit board and then use a dedicated writer to perform the write operation. The reprogramming operation can be initiated either by an external reprogramming-enable signal or an internal reprogramming-enable signal. When either of these two signals is generated, it causes an OR gate to output a high-voltage logic signal to a multiplexer to thereby cause the multiplexer to select a ROM unit for connection to the microprocessor unit. This allows the microprocessor unit to execute a reprogramming control routine stored in the ROM unit. The flash memory unit further stores a reprogramming detection/initialization routine which checks whether a flash reprogramming request signal is issued from the main-unit interface. With this microcontroller architecture, the reprogramming of data into the embedded flash memory can be performed on-board without having to laboriously dismount the microcontroller from the circuit board. The reprogramming operation is therefore quite easy and quick to perform, thus more cost-effective than the prior art.

12 Claims, 6 Drawing Sheets

MICROCONTROLLER WITH PROGRAMMABLE EMBEDDED FLASH MEMORY

CROSS-REFERENCE TO RELATED APPLICATION

This application claims the priority benefit of Taiwan application serial no. 86116153, filed Oct. 30, 1997, the full disclosure of which is incorporated herein by reference.

BACKGROUND OF THE INVENTION

1. Field of the Invention

This invention relates to microcontroller architectures, and more particularly, to a microcontroller with programmable embedded flash memory, which allows the programming or reprogramming of data into the flash memory to be conveniently carried out on-board.

2. Description of Related Art

A microcontroller is a "computer-on-one-chip" integrated circuit that comes with a complete microprocessor unit and embedded memory and input/output (I/O) units. The embedded memory is usually flash memory which is an erasable, reprogrammable kind of memory that permits a data block or groups of blocks to be erased and reprogrammed without having to erasing the entire memory. Conventionally, the programming of data into the flash memory should be performed off-board and requires the use of a dedicated writer to perform.

If a microcontroller is already soldered in position on a circuit board and reprogramming of data into its embedded flash memory is required, the entire IC package of the microcontroller should be dismounted from the circuit board before the reprogramming operation can be performed. Due to this drawback, in the event that any bugs are found in the embedded flash memory in the microcontroller after the circuit boards have been delivered to the customers, the repair would involve very laborious work. There exists, therefore, a need for a method that allows the reprogramming of data into the embedded flash memory in the microcontroller to be performed on-board without having to dismount the microcontroller from the circuit board.

Various solutions to the foregoing problem have been disclosed. For example, the U.S. Pat. No. 5,495,593 to Thomas et. al. teaches the use of serial port to perform the reprogramming of data into the embedded flash memory of microcontroller; and moreover, the U.S. Pat. No. 5,596,734 to Lawrence teaches the use of test pins for the reprogramming. These solutions, however, still have some drawbacks. First, they are not applicable to microcontrollers that are provided with no serial ports or test pins. For this kind of microcontrollers, the reprogramming requires the use of additional external circuits and modifications to the internal circuitry of the microcontroller. Second, the use of the serial port to perform the reprogramming is relative slow in speed. If the capacity of the embedded flash memory is large, it would take quite a lengthy period of time to complete the reprogramming.

FIG. 1 is a schematic block diagram showing a conventional architecture of microcontroller, as designated by the reference numeral I 0, which is mounted on a circuit board and connected via an interface 20 to a main unit (not shown) that is under control by the microcontroller 10. As shown, the microcontroller 10 includes a microprocessor unit 16 and a flash memory unit 12. The flash memory unit 12 is connected via an internal data bus 14 to the microprocessor unit 16, while the microprocessor unit 16 is connected via an external data bus 18 to the main-unit interface 20.

In operation, the microprocessor unit 16 executes a main control program fetched via the internal data bus 14 from the flash memory unit 12 to thereby perform a control function specific to the microcontroller 10. The control signals issued by the microprocessor unit 16 are then transferred via the external data bus 18 and the interface 20 to the main unit (not shown) which is under control by the microcontroller 10.

One drawback to the foregoing microcontroller system, however, is that when the flash memory unit 12 in the microcontroller 10 needs to be reprogrammed, the entire IC package of the microcontroller 10 should be dismounted from the circuit board and then mounted on a dedicated writer or programmer to write the new data into the flash memory unit 12. After the reprogramming is completed, the entire IC package of the microcontroller 10 is then remounted back onto the circuit board. The reprogramming is therefore quite inconvenient and time-consuming to perform.

SUMMARY OF THE INVENTION

It is therefore an objective of the present invention to provide a new architecture for microcontroller with embedded flash memory, which allows the reprogramming of data into the embedded flash memory to be performed on-board without having to dismount the entire IC package of the microcontroller from the circuit board and use a dedicated writer to perform the reprogramming operation.

It is another an objective of the present invention to provide a new architecture for microcontroller with embedded flash memory, which allows the reprogramming of data into the embedded flash memory to be performed in a parallel manner so that the reprogramming time can be significantly reduced.

It is still another objective of the present invention to provide a new architecture for microcontroller with embedded flash memory, which allows the reprogramming of data into the embedded flash memory to be performed in an easier, quicker, and more cost-effective manner than the prior art.

In accordance with the foregoing and other objectives of the present invention, a new architecture for microcontroller with embedded flash memory unit is provided. The microcontroller of the invention includes the following constituent components: a microprocessor unit coupled via a data bus to the main-unit interface, the microprocessor unit capable of generating an internal reprogramming-enable signal and a set of latch-enable signals; a ROM unit used to store a reprogramming control routine therein; a flash memory unit used to store a main control program for execution by the microprocessor unit to perform a control function specific to the microcontroller, an external jumper capable of being manually set to generate an external reprogramming-enable signal; an OR gate coupled to the microprocessor unit and the external jumper, capable of generating a selection signal when either of the internal reprogramming-enable signal and the external reprogramming-enable signal is present; a multiplexer having two input ends respectively connected to the data buses of the ROM unit and the flash memory unit, the multiplexer selecting the ROM unit for connection to the microprocessor unit when the selection signal from the OR gate is present, and selecting the flash memory unit otherwise; and a latch buffer coupled between the flash memory unit and the microprocessor unit, the latch buffer being under control in response to the latch-enable signals from the microprocessor unit for buffering the data transfer between the flash memory unit and the microprocessor unit.

In the foregoing microcontroller, the generation of either of the internal reprogramming-enable signal and the external reprogramming-enable signal causes the multiplexer to select the ROM unit for connection to the microprocessor unit, causing the microprocessor unit to execute the reprogramming control routine stored in the ROM unit to control a reprogramming operation to write data into the flash memory unit.

When either of the external reprogramming-enable signal and the internal reprogramming-enable signal is generated, it causes the OR gate to output a high-voltage logic signal to the multiplexer to thereby cause the multiplexer to select the ROM unit for connection to the microprocessor unit. This allows the microprocessor unit to execute the reprogramming control routine stored in the ROM unit to control a reprogramming operation to write data into the flash memory unit.

The flash memory unit further stores a reprogramming detection/intialization routine which is executed by the microprocessor unit to check whether a flash-reprogramming request signal is issued from the main-unit interface. The reprogramming control routine stored in said ROM unit is used to control the microprocessor unit to receive the data to be reprogrammed into the flash memory unit from the main-unit interface.

Alternatively, the external jumper and the OR gate in the foregoing architecture can be eliminated. In this architecture, the reprogramming-enable signal is exclusively generated by the microprocessor unit.

In conclusion, the invention allows the reprogramming of data into the embedded flash memory of a microcontroller to be performed on-board without having to dismount the microcontroller (usually by removing the solder, which is quite laborious to do) from the circuit board. The reprogramming process is therefore quite easy and quick to perform, thus more cost-effective than the prior art.

Moreover, the invention allows the reprogramming of data into the embedded flash memory of the microcontroller to be performed in a parallel manner so that the reprogramming time can be significantly reduced.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new architecture for microcontroller with embedded flash memory that allows the reprogramming of data into the flash memory unit to be performed on-board without having to dismount the entire IC package of the microcontroller from the circuit board. The data to be reprogramming into the microcontroller can be written into the embedded flash memory directly through a main-unit interface connected between the microcontroller of the invention and the main unit which is under control by the microcontroller. Detailed architecture of the microcontroller of the invention is disclosed in the following.

Figure 1:
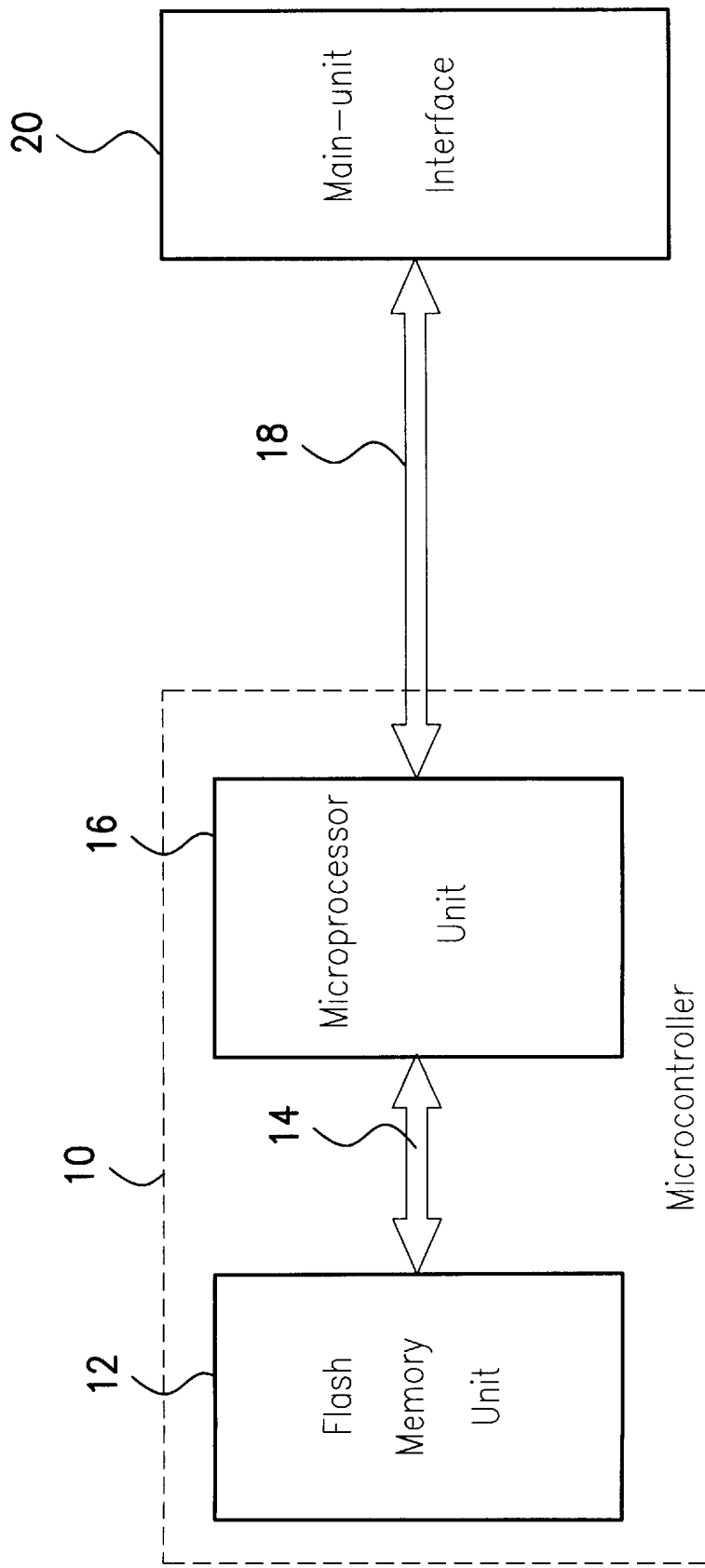
FIG. 1 is a schematic block diagram showing a conventional architecture of microcontroller with a programmable embedded flash memory unit.
Figure 2:
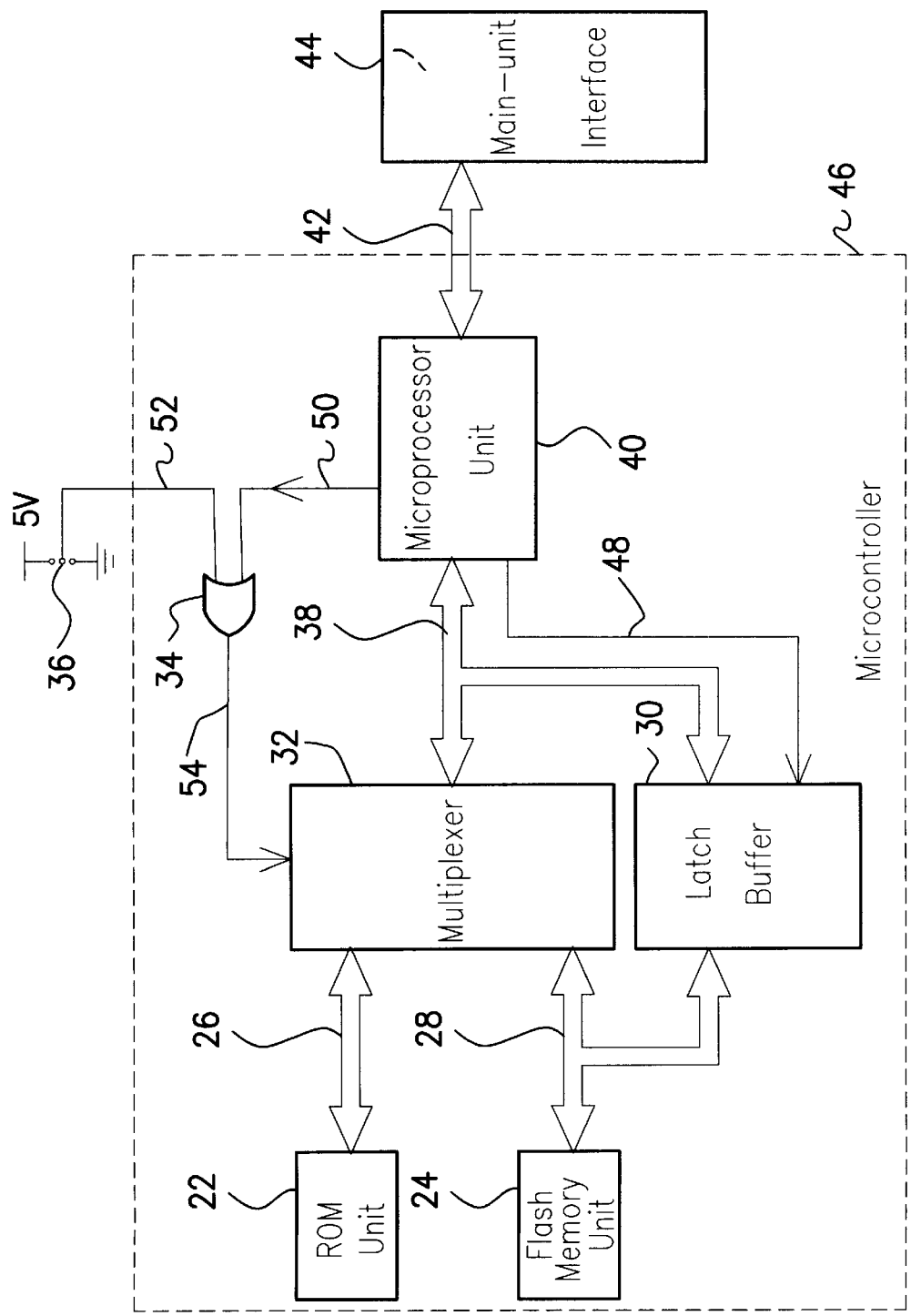
FIG. 2 is a schematic block diagram showing the architecture of a first preferred embodiment of the microcontroller with embedded flash memory according to the invention.

FIG. 2 is a schematic block diagram showing the architecture of a first preferred embodiment of the microcontroller of the invention, as here designated by the reference numeral 46, which is connected via an external data bus 42 and an interface 44 to a main unit (not shown) that is under control by the microcontroller 46. As shown, the microcontroller 46 of this embodiment includes a microprocessor unit 40, a latch buffer 30, a multiplexer 32, an OR gate 34, an external jumper 36, a ROM unit 22, and a flash memory unit 24.

The reprogramming operation can be initiated in two ways: either by using the external jumper 36 to manually issue a first reprogramming-enable signal or by using the signal line 50 to issue a second reprogramming-enable signal in response to a flash-reprogramming request signal from the main-unit interface 44. In normal use of the microcontroller 46, the external jumper 36 is set to a ground position, whereby a low-voltage logic signal (i.e., first reprogramming-enable signal is disabled), for example a 0 V signal, is transferred via the signal line 52 to the OR gate 34, and meanwhile the microprocessor unit 40 outputs and transfers a low-voltage logic signal (i.e., second reprogramming-enable signal is disabled) via the signal line 50.

This causes the OR gate 34 to output and transfer a low-voltage logic signal via the signal line 54 to the multiplexer 32. The output from the OR gate 34 serves as a selection signal to the multiplexer 32 in such a manner that when the selection signal is at a low-voltage state, the data bus 26 connected to the ROM unit 22 is selected for connection via the data bus 38 to the microprocessor unit 40; and when at a high-voltage state, the data bus 28 connected to the flash memory unit 24 is selected for connection via the data bus 38 to the microprocessor unit 40.

Therefore, in the foregoing case, the data bus 28 is selected to connect the flash memory unit 24 to the microprocessor unit 40, allowing the microprocessor unit 40 to fetch and execute a main control program stored in the flash memory unit 24 to thereby perform a control function specific to the microcontroller 46. The control signals issued by the microprocessor unit 40 are then transferred via the external data bus 42 and the interface 44 to the main unit (not shown) which is under control by the microcontroller 46.

The flash memory unit 24 further stores a reprogramming detection/initialization routine which is continually executed by the microprocessor unit 40 to detect whether a flash-reprogramming request signal is issued from the main-unit interface 44. In the event that the flash-reprogramming request signal is present, the microprocessor unit 40 will reset a reprogramming counter (not shown) therein to zero, and meanwhile generate and transfer a second reprogramming-enable signal (i.e., by switching the logic state on the signal line 50 to a high-voltage state), causing the OR gate 34 to output, irrespective of the logic state on the other input end, a high-voltage logic signal to the multiplexer 32. In response to the high-voltage logic signal from the OR gate 34, the multiplexer 32 selects the data bus 26 connected to the ROM unit 22 for connection via the data bus 38 to the microprocessor unit 40.

The foregoing action allows the microprocessor unit 40 to fetch and execute a reprogramming control routine from the ROM unit 22, which controls the microprocessor unit 40 to receive the data to be reprogrammed into the flash memory unit 24 via the external data bus 42 from the interface 44 and transfer these data to the flash memory unit 24 via the data bus 38, the latch buffer 30, and the data bus 28. Moreover, the microprocessor unit 40 uses a signal bus 48 to transfer control signals to the latch buffer 30 for controlling the data transfer through the latch buffer 30.

The data to be reprogrammed into the flash memory unit 24 are received in blocks. Each block of data is temporarily stored in the latch buffer 30 and then transferred via the data bus 28 to the flash memory unit 24. This reprogramming operation is repeated until all blocks of data are written into the flash memory unit 24 in the foregoing manner.

If the microcontroller 46 is newly fabricated in factory without any program code and data stored in the flash memory unit 24, the microcontroller 46 can be manually set to the programming mode by switching the external jumper 36 to a high-voltage position which is connected to a system voltage, for example 5 V (volt). This causes the generation of the first reprogramming-enable signal which is then transferred via the signal line 52 to the OR gate 34, causing the OR gate 34, irrespective of the logic state on the other input end (i.e., the signal line 50), to output a high-voltage logic signal via the signal line 54 to the multiplexer 32.

As a result of this, the multiplexer 32 selects the data bus 26 connected to the ROM unit 22 for connection via the data bus 38 to the microprocessor unit 40. This action causes the microprocessor unit 40 to fetch and execute a reprogramming control routine from the ROM unit 22, which controls the microprocessor unit 40 to receive the data to be reprogrammed into the flash memory unit 24 via the external data bus 42 from the interface 44 and transfer these data to the flash memory unit 24 via the data bus 38, the latch buffer 30, and the data bus 28.

Moreover, the microprocessor unit 40 uses a signal bus 48 to transfer control signals to the latch buffer 30 for controlling the data transfer through the latch buffer 30. The data to be reprogrammed into the flash memory unit 24 are received in blocks. Each block of data is temporarily stored in the latch buffer 30 and then transferred via the data bus 28 to the flash memory unit 24. This reprogramming operation is repeated until all blocks of data are written into the flash memory unit 24 in the foregoing manner.

Figure 3:
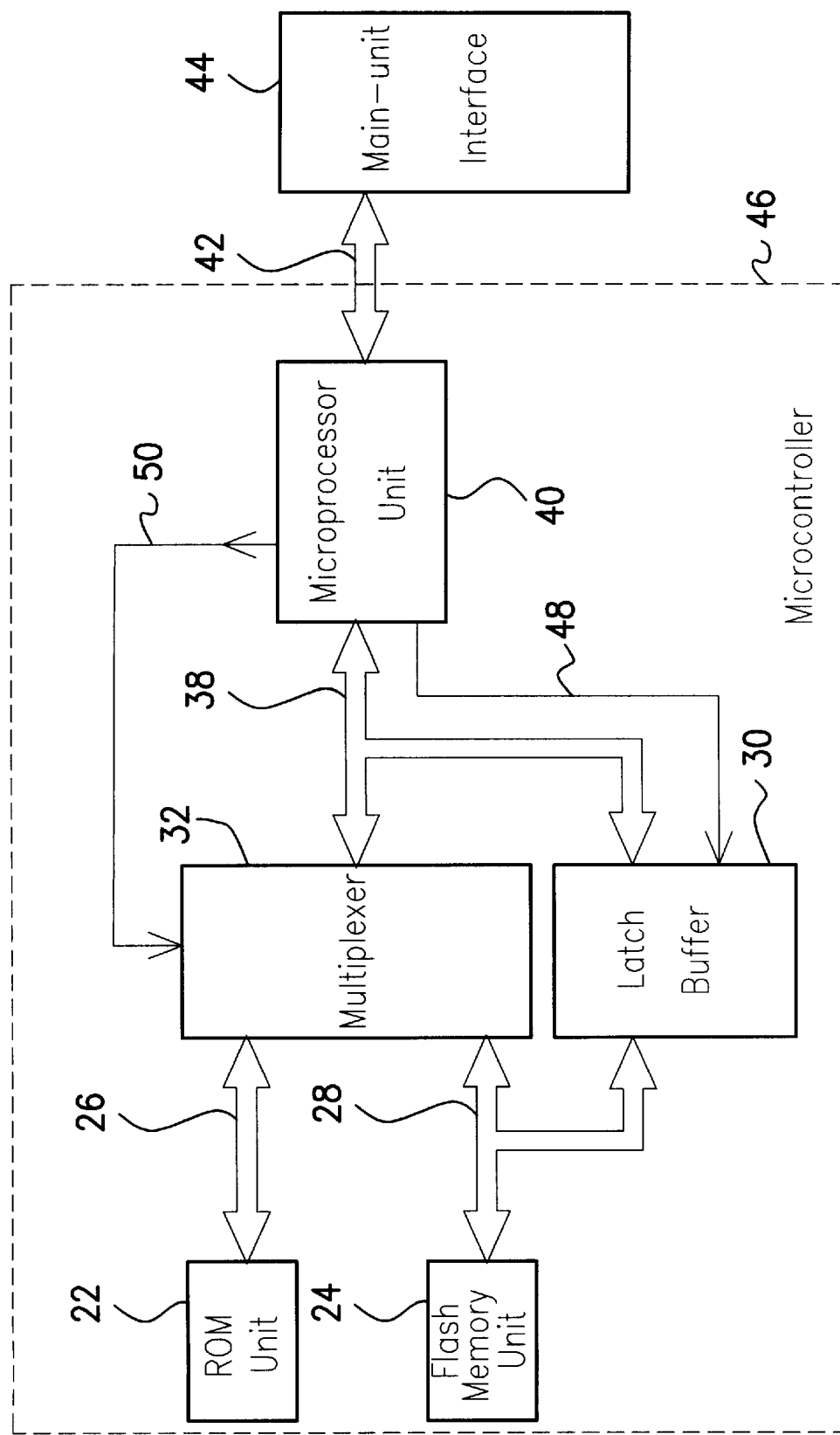
FIG. 3 is a schematic block diagram showing the architecture of a second preferred embodiment of the microcontroller with embedded flash memory according to the invention.

FIG. 3 is a schematic block diagram showing the architecture of a second preferred embodiment of the microcontroller of the invention. In FIG. 3, the constituent elements that are identical to those in the previous embodiment of FIG. 2 are labeled with the same reference numerals. This embodiment differs from the previous one only in that the OR gate 34 and the external jumper 36 used in the previous embodiment are here eliminated.

In this embodiment, therefore, the reprogramming-enable signal is solely generated by the microprocessor unit 40. Whenever a reprogramming operation is desired, the technician can trigger the generation of a flash-reprogramming request signal and input it through the interface 44 to the microprocessor unit 40.

In normal use of the microcontroller 46, the microprocessor unit 40 generates and transfers a low-voltage logic signal (i.e., the reprogramming-enable signal is disabled) via the signal line 50 to the multiplexer 32, causing the multiplexer 32 to select the data bus 28 connected to the flash memory unit 24 for connection via the data bus 38 to the microprocessor unit 40. This allows the microprocessor unit 40 to fetch and execute a main control program from the flash memory unit 24. During this operation, the microprocessor unit 40 will also execute a reprogramming detection/initialization routine that continually detects whether a flash-reprogramming request signal is received from the interface 44.

When the flash-reprogramming request signal is present, the microprocessor unit 40 will switch the logic state on the signal line 50 to a high-voltage state (i.e., the reprogramming-enable signal is generated), causing the OR gate 34 to output a high-voltage logic signal to the multiplexer 32. In response, the multiplexer 32 selects the data bus 26 connected to the ROM unit 22 for connection via the data bus 38 to the microprocessor unit 40.

This action allows the microprocessor unit 40 to fetch and execute a reprogramming control routine from the ROM unit 22, which controls the microprocessor unit 40 to receive and transfer the data to be programmed into the flash memory unit 24 via the data bus 38, the latch buffer 30, and the data bus 28 to the flash memory unit 24 in a similar manner described earlier in this section.

Figure 4:
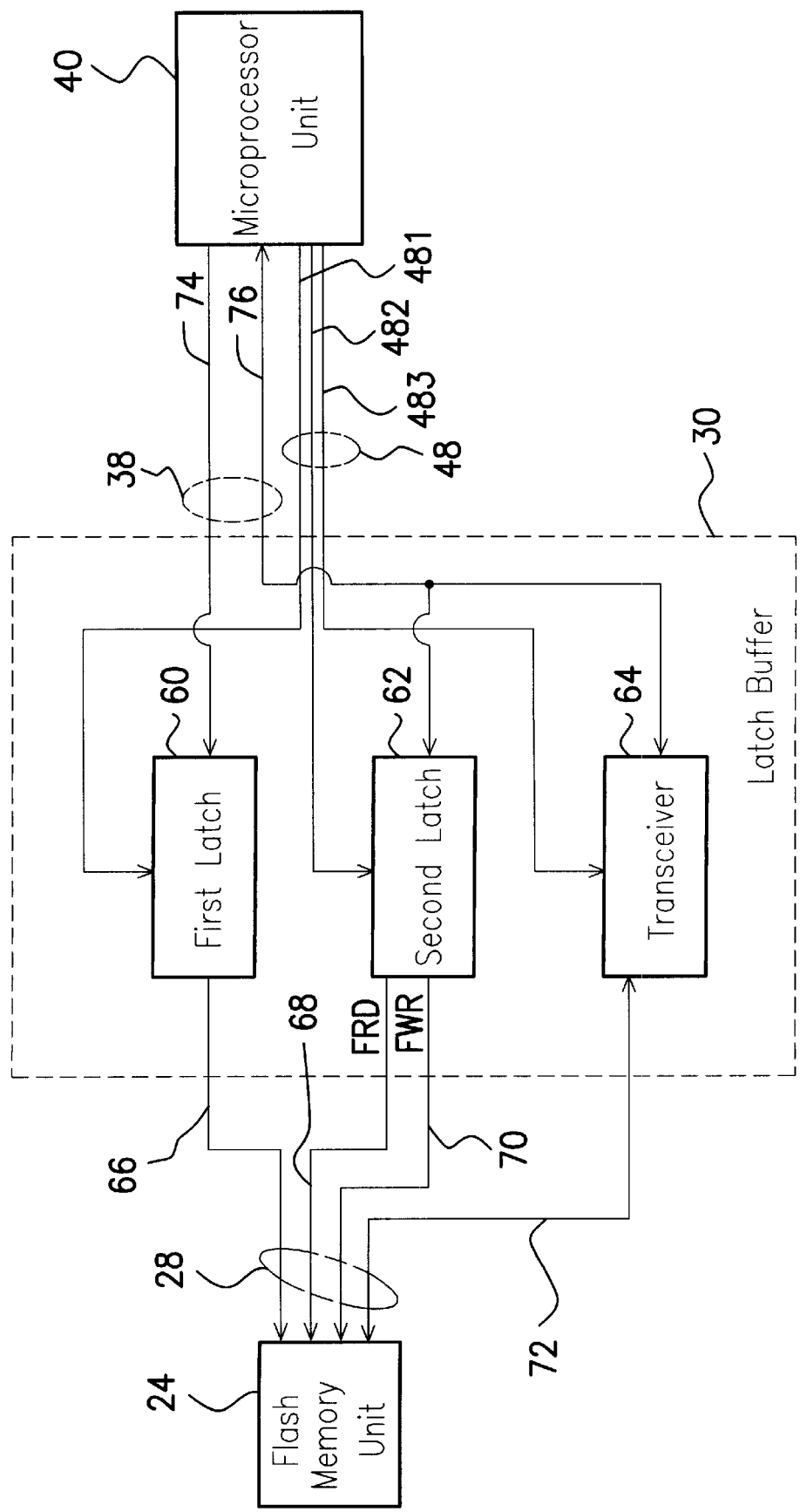
FIG. 4 is a schematic block diagram showing the inside structure of a latch buffer utilized in the microcontroller of the invention.

FIG. 4 is a schematic block diagram showing the inside structure of the latch buffer 30 utilized in the microcontroller of the invention. As shown, the latch buffer 30 includes a first latch 60, a second latch 62, and a transceiver 64. Moreover, the data bus 28 includes an address signal line 66 connected between the flash memory unit 24 and the first latch 60, a flash read-request signal line 68 for transferring a flash read-request signal FRD from the second latch 62 to the flash memory unit 24, a flash write-request signal line 70 for transferring a flash write-request signal FWR from the second latch 62 to the flash memory unit 24, and a data line 72 for transferring data between the flash memory unit 24 and the transceiver 64.

The data bus 38 includes an address signal line 74 connected between the first latch 60 and the microprocessor unit 40 and a data line 76 which connects the microprocessor unit 40 to both the transceiver 64 and the second latch 62. The signal bus 48 includes a first signal line 481 for transferring a first latch-enable signal from the microprocessor unit 40 to the first latch 60, a second signal line 482 for transferring a second latch-enable signal from the microprocessor unit 40 to the second latch 62, and a third signal line 483 for transferring a transmission/reception control signal from the microprocessor unit 40 to the transceiver 64.

The transceiver 64 is a bi-directional buffer that can transfer data from the microprocessor unit 40 to the flash memory unit 24, or vice versa from the flash memory unit 24 to the microprocessor unit 40. The direction is determined by the logic state of the transmission/reception control signal.

When a write operation (i.e., a reprogramming operation) is to be performed on the flash memory unit 24, the microprocessor unit 40 generates and transfers a first latch-enable signal via the signal line 481 to the first latch 60 while outputting the address signal (which indicates the location in the flash memory unit 24 where the data are to be stored) via the address signal line 74 to the first latch 60. This causes the first latch 60 to latch the address signal therein and then transfers the latched address signal via the address signal line 66 to the flash memory unit 24.

Meanwhile, the microprocessor unit 40 generates and transfers a second latch-enable signal via the second latch-enable signal line 482 to the second latch 62 so as to enable second latch 62 to receive a flash write-request signal FWR and latch it on the signal line 70. Subsequently, the microprocessor unit 40 generates and transfers a transmission/reception control signal (at a high-voltage state, for example) via the signal line 483 to the transceiver 64 to set the transceiver 64 in transmission mode while outputting a data signal (i.e., the binary code to be reprogrammed into the flash memory unit 24) via the data line 76 to the transceiver 64.

The transceiver 64 then transfers the received data via the data line 72 to the flash memory unit 24. This causes the flash memory unit 24 to receive the data signal on the data line 72 and then store the binary code represented by this data signal into the locations specified by the address signal on the address signal line 66.

When a read operation is to be performed on the flash memory unit 24 (i.e., to read the binary code of the main control program and the reprogramming detection/initialization routine stored in the flash memory unit 24), the microprocessor unit 40 generates and transfers a first latch-enable signal via the signal line 481 to the first latch 60 while outputting the address signal (which indicates the location in the flash memory unit 24 where the data to be read out are stored) via the address signal line 74 to the first latch 60.

This causes the first latch 60 to latch the address signal therein and then puts the latched address signal on the address signal line 66. Subsequently, the microprocessor unit 40 generates and transfers a second latch-enable signal via the signal line 482 to the second latch 62, thus enabling the second latch 62 to receive a flash read-request signal FRD via the data line 76 and latch it on the signal line 68 connected to the flash memory unit 24. Meanwhile, the microprocessor unit 40 generates and transfers a transmission/reception control signal (at a low-voltage state, for example) via the signal line 483 to the transceiver 64 to thereby set the transceiver 64 in the reception mode.

In response to the flash read-request signal FRD, the flash memory unit 24 fetches out the data stored in the location indicated by the address signal on the address signal line 66 and then transfers these data via the data line 72 to the transceiver 64 which then forwards these data to the microprocessor unit 40.

Figure 5:
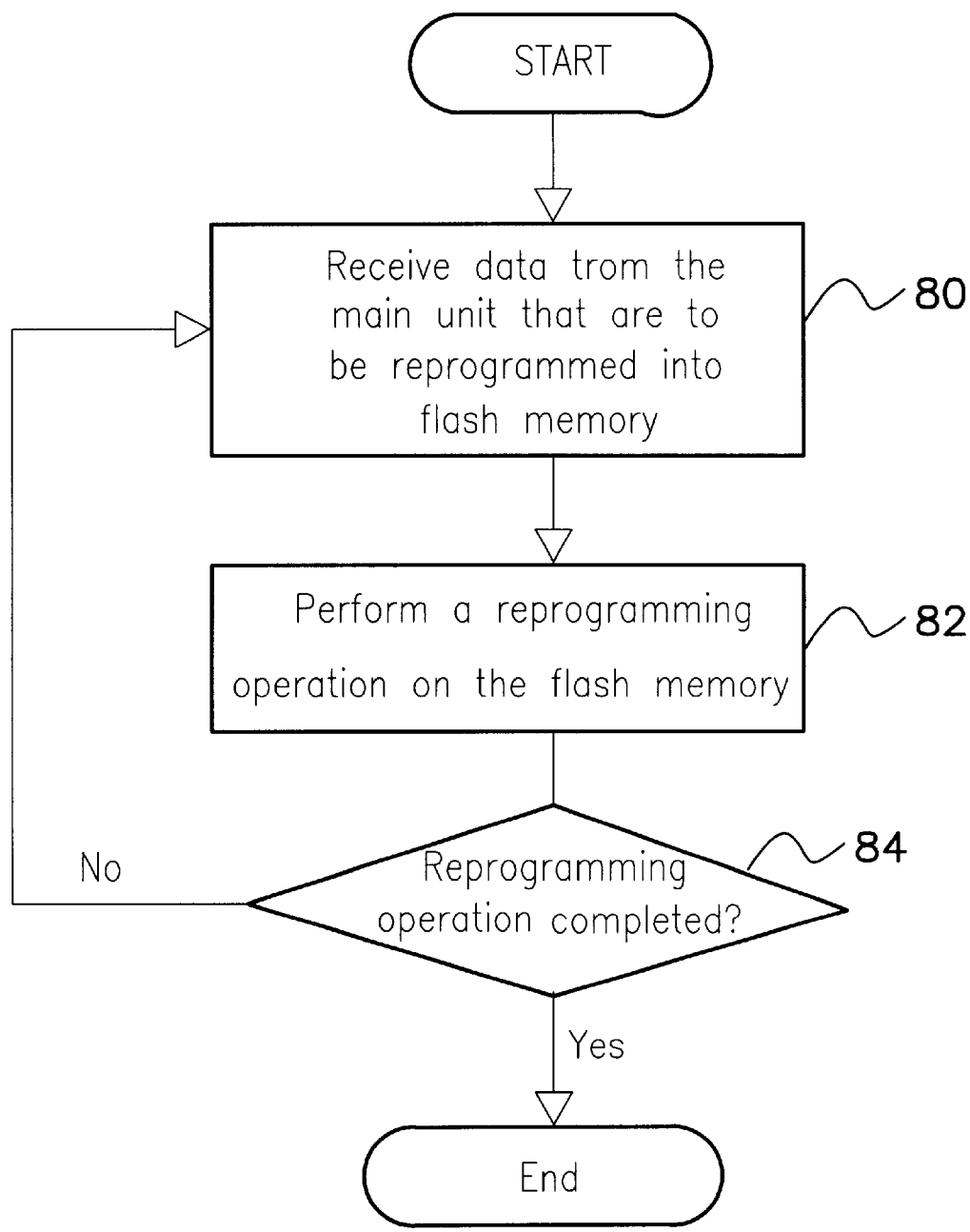
FIG. 5 is a flow diagram showing the procedural steps of a reprogramming control routine stored in the ROM unit in the microcontroller of the invention.

FIG. 5 is a flow diagram showing the procedural steps of the reprogramming control routine stored in the ROM unit 22 which is executed by the microprocessor unit 40 to control the reprogramming of data into the flash memory unit 24. Referring to FIG. 5 together with FIGS. 2 and 3, in the first step 80, the microprocessor unit 40 receives the data to be programmed into the flash memory unit 24 via the interface 44 from the main unit (not shown).

The data include an address signal, a flash read/write request signal, and a data signal. These signals are stored into the latch buffer 30 in a manner as described earlier in this section. In the subsequent step 82, the microprocessor unit 40 clears the flash memory unit 24 and then performs a reprogramming operation to write the received data into the flash memory unit 24. In the subsequent step 84, the microprocessor unit 40 checks whether the programming operation is completed; if not, the procedure goes back to step 80; otherwise, the procedure is ended.

Figure 6:
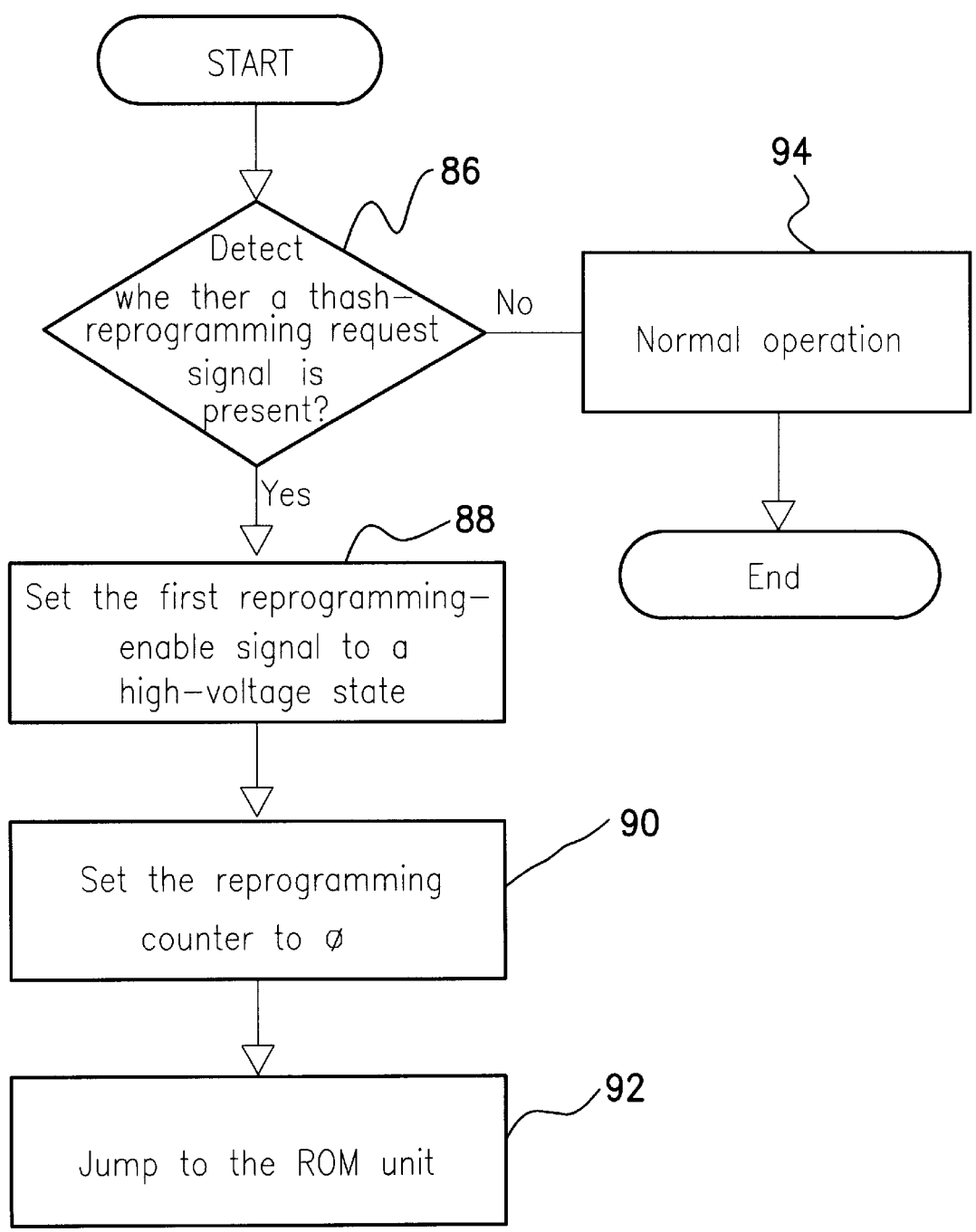
FIG. 6 is a flow diagram showing the procedural steps of a reprogramming detection/initialization routine stored in the flash memory unit in the microcontroller of the invention.

FIG. 6 is a flow diagram showing the procedural steps of the reprogramming detection/initialization routine stored in the flash memory unit 24 which is executed by the microprocessor unit 40 to check whether reprogramming operation is to be performed. In the first step 86, the microprocessor unit 40 detects whether a flash-reprogramming request signal is received via the interface 44 from the main unit (not shown); if not, the procedure goes to step 94 to continue the normal operation of the microcontroller; otherwise, the procedure goes to step 88, in which the microprocessor unit 40 sets the first reprogramming-enable signal to a high-voltage state.

In the subsequent step 90, the microprocessor unit 40 resets a reprogramming counter to zero; and then in the subsequent step 92, the procedure jumps to the ROM unit 22 to execute the reprogramming control routine stored therein.

In conclusion, the invention allows the reprogramming of data into the embedded flash memory of a microcontroller to be performed on-board without having to dismount the entire IC package of the microcontroller (usually, having to remove the solders, which is quite laborious to do) from the circuit board. The reprogramming operation is therefore quite easy and quick to perform, thus more cost-effective than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A microcontroller coupled to a main-unit interface, which comprises:

a microprocessor unit coupled via an external data bus to said main-unit interface, said microprocessor unit generating an internal reprogramming-enable signal and a set of latch-enable signals for control of data transfer during a reprogramming operation;

a ROM unit used to store a reprogramming control routine therein;

a flash memory unit used to store a main control program for execution by said microprocessor unit to perform a control function specific to said microcontroller;

an external jumper being manually set to generate an external reprogramming-enable signal;

an OR gate coupled to said microprocessor unit and said external jumper for generating a selection signal when either of said internal reprogramming-enable signal and said external reprogramming-enable signal is present;

a multiplexer having two input ends respectively connected to the data buses of said ROM unit and said flash memory unit and one output end connected to the data bus of said microprocessor unit, said multiplexer selecting said ROM unit for connection to said microprocessor unit when said selection signal from said OR gate is present, and selecting said flash memory unit otherwise; and a latch buffer coupled between said flash memory unit and said microprocessor unit, said latch buffer being under control in response to the latch-enable signals from said microprocessor unit for data transfer between said flash memory unit and said microprocessor unit;

wherein the generation of either of said internal reprogramming-enable signal and said external reprogramming-enable signal causes said multiplexer to select the ROM unit for connection to the microprocessor unit, causing the microprocessor unit to execute said reprogramming control routine stored in said ROM unit to control a reprogramming operation to write data into said flash memory unit.

2. The microcontroller of claim 1, wherein said external jumper is switchable between a system voltage and a ground voltage in such a manner that when said external jumper is switched to the system voltage, the external reprogramming-enable signal is triggered to generate.

3. The microcontroller of claim 2, wherein the external reprogramming-enable signal from said external jumper causes said multiplexer to select the ROM unit for connection to the microprocessor unit, causing the microprocessor unit to execute said reprogramming control routine stored in said ROM unit to control a reprogramming operation to write data into said flash memory unit.

4. The microcontroller of claim 1, wherein said flash memory unit further stores a reprogramming detection/initialization routine which is executed by said microprocessor unit to detect whether a flash-reprogramming request signal is issued from said main-unit interface.

5. The microcontroller of claim 1, wherein said reprogramming control routine stored in said ROM unit is used to control said microprocessor unit to receive the data to be reprogrammed into said flash memory unit from said main-unit interface.

6. The microcontroller of claim 5, wherein said data to be reprogrammed into said flash memory unit include a data signal, an address signal, and a control signal.

7. The microcontroller of claim 6, wherein said latch buffer comprises:

a first latch, in response to a first latch-enable signal from said microprocessor unit, for latching the address signal on a data bus connected to said flash memory unit;

a second latch, in response to a second latch-enable signal from said microprocessor unit, for latching a flash read/write request signal on a signal line connected to said flash memory unit; and a transceiver coupled between said flash memory unit and said microprocessor unit; said transceiver operating in response to a transmission/reception control signal in such a manner that during a write operation, said transmission/reception control signal setting said transceiver to a transmission mode, causing said transceiver to transfer the data signal received by said microprocessor unit from said main-unit interface to said flash memory unit; and during a read operation, said transmission/reception control signal setting said transceiver to a reception mode, causing said transceiver to transfer the data read from said flash memory unit to said microprocessor unit.

8. A microcontroller coupled to a main-unit interface, which comprises:

a microprocessor unit coupled via an external data bus to said main-unit interface, said microprocessor unit generating an internal reprogramming-enable signal and a set of latch-enable signals for control of data transfer during a reprogramming operation;

a ROM unit used to store a reprogramming control routine therein;

a flash memory unit used to store a main control program for execution by said microprocessor unit to perform a control function specific to said microcontroller;

a multiplexer having two input ends respectively connected to the data buses of said ROM unit and said flash memory unit, said multiplexer selecting said ROM unit for connection to said microprocessor unit when said internal reprogramming-enable signal from said microprocessor unit is present, and selecting said flash memory unit otherwise; and a latch buffer coupled between said flash memory unit and said microprocessor unit, said latch buffer being under control in response to the latch-enable signals from said microprocessor unit for data transfer between said flash memory unit and said microprocessor unit;

wherein the generation of said internal reprogramming-enable signal from said microprocessor unit causes said multiplexer to select the ROM unit for connection to the microprocessor unit, causing the microprocessor unit to execute said reprogramming control routine stored in said ROM unit to control a reprogramming operation to write data into said flash memory unit.

9. The microcontroller of claim 8, wherein said reprogramming control routine stored in said ROM unit is used to control said microprocessor unit to receive the data to be reprogrammed into said flash memory unit from said main-unit interface.

10. The microcontroller of claim 8, wherein said reprogramming control routine stored in said ROM unit is used to control said microprocessor unit to receive the data to be reprogrammed into said flash memory unit from said main-unit interface.

11. The microcontroller of claim 10, wherein said data to be reprogrammed into said flash memory unit include a data signal, an address signal, and a control signal.

12. The microcontroller of claim 8, wherein said latch buffer comprises:

a first latch, in response to a first latch-enable signal from said microprocessor unit, for latching the address signal on a data bus connected to said flash memory unit;

a second latch, in response to a second latch-enable signal from said microprocessor unit, for latching a flash read/write request signal on a signal line connected to said flash memory unit; and a transceiver coupled between said flash memory unit and said microprocessor unit; said transceiver operating in response to a transmission/reception control signal in such a manner that during a write operation, said transmission/reception control signal setting said transceiver to a transmission mode, causing said transceiver to transfer the data signal received by said microprocessor unit from said main-unit interface to said flash memory unit; and during a read operation, said transmission/reception control signal setting said transceiver to a reception mode, causing said transceiver to transfer the data read from said flash memory unit to said microprocessor unit.

* * * * *